United States Patent
Yamashita et al.

(10) Patent No.: US 11,469,355 B2
(45) Date of Patent: Oct. 11, 2022

(54) WAVELENGTH CONVERSION PART, METHOD OF MANUFACTURING WAVELENGTH CONVERSION PART, AND LIGHT EMITTING DEVICE

(71) Applicant: NICHIA CORPORATION, Anan (JP)

(72) Inventors: Toshiaki Yamashita, Komatsushima (JP); Akinori Hara, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/581,781

(22) Filed: Jan. 21, 2022

(65) Prior Publication Data

US 2022/0149252 A1 May 12, 2022

Related U.S. Application Data

(63) Continuation of application No. 16/853,045, filed on Apr. 20, 2020, now Pat. No. 11,264,544.

(30) Foreign Application Priority Data

Apr. 22, 2019 (JP) .............................. JP2019-081379

(51) Int. Cl.
*H01L 33/50* (2010.01)
*F21V 9/32* (2018.01)
(Continued)

(52) U.S. Cl.
CPC .............. *H01L 33/505* (2013.01); *F21V 9/32* (2018.02); *H01S 5/0087* (2021.01);
(Continued)

(58) Field of Classification Search
CPC . H01L 33/505; H01S 5/02255; H01S 5/0087; H01S 5/02469; F21V 9/32
(Continued)

(56) References Cited

U.S. PATENT DOCUMENTS 10,508,791 B2 * 12/2019 Drumm ..................... F21V 9/30
2008/0165523 A1 * 7/2008 Schmidt .............. C04B 35/6455
423/263
(Continued)

FOREIGN PATENT DOCUMENTS

EP     3 399 604 A1    11/2018
JP     2007-317956 A   12/2007
(Continued)

OTHER PUBLICATIONS

Final Office Action on U.S. Appl. No. 16/853,045 dated Jun. 10, 2021 (10 pages).
(Continued)

*Primary Examiner* — Bryon T Gyllstrom
(74) *Attorney, Agent, or Firm* — Foley & Lardner LLP

(57) ABSTRACT

A wavelength conversion part includes: a wavelength conversion member formed primarily of a ceramic material; an enclosing member formed primarily of a ceramic material, wherein the enclosing member surrounds one or more lateral faces of the wavelength conversion member; and a heat dissipating member having an upper face, wherein the heat dissipating member is fixed to the wavelength conversion member, and wherein the upper face of the heat dissipating member opposes lower faces of the wavelength conversion member and enclosing member. The lower face of the wavelength conversion member projects towards the heat dissipating member beyond the lower face of the enclosing member. A portion of the lower face of the enclosing member is separated from the upper face of the heat dissipating member by an air gap.

14 Claims, 10 Drawing Sheets

(51) Int. Cl.
*H01S 5/024* (2006.01)
*H01S 5/02255* (2021.01)
*H01S 5/00* (2006.01)
*F21Y 115/30* (2016.01)

(52) U.S. Cl.
CPC ...... *H01S 5/02255* (2021.01); *H01S 5/02469* (2013.01); *F21Y 2115/30* (2016.08)

(58) Field of Classification Search
USPC .......................................................... 362/84
See application file for complete search history.

(56) References Cited

U.S. PATENT DOCUMENTS

| | | | |
|---|---|---|---|
| 2011/0149549 A1* | 6/2011 | Miyake | G03B 21/204 362/84 |
| 2011/0227469 A1* | 9/2011 | Yuan | F21V 3/08 313/46 |
| 2014/0233210 A1* | 8/2014 | Owada | F21S 41/16 362/84 |
| 2014/0254133 A1* | 9/2014 | Kotter | F21V 9/38 29/428 |
| 2014/0268644 A1* | 9/2014 | Berben | F21V 29/86 362/351 |
| 2017/0102118 A1* | 4/2017 | Nauen | F21V 9/45 |
| 2017/0122505 A1 | 5/2017 | Kiyota et al. | |
| 2017/0345984 A1 | 11/2017 | Yamashita | |
| 2018/0149954 A1 | 5/2018 | Akiyama | |
| 2018/0283636 A1* | 10/2018 | Nauen | F21S 45/47 |
| 2019/0081452 A1 | 3/2019 | Miura et al. | |
| 2019/0097095 A1* | 3/2019 | Yamanaka | F21V 13/14 |
| 2019/0148609 A1 | 5/2019 | Yamashita | |
| 2020/0200347 A1 | 6/2020 | Uwani et al. | |

FOREIGN PATENT DOCUMENTS

| | | |
|---|---|---|
| JP | 2017-216362 A | 12/2017 |
| JP | 2017-223869 A | 12/2017 |
| JP | 2018-087918 A | 6/2018 |
| JP | 2018-088307 A | 6/2018 |
| JP | 2019-009406 A | 1/2019 |
| JP | 2019-053130 A | 4/2019 |
| WO | WO-2017/195620 A1 | 11/2017 |

OTHER PUBLICATIONS

Non-Final Office Action on U.S. Appl. No. 16/853,045 dated Dec. 10, 2020 (10 pages).
Notice of Allowance on U.S. Appl. No. 16/853,045 dated Oct. 26, 2021 (10 pages).

* cited by examiner

WAVELENGTH CONVERSION PART, METHOD OF MANUFACTURING WAVELENGTH CONVERSION PART, AND LIGHT EMITTING DEVICE

CROSS-REFERENCE TO RELATED APPLICATION

This application is a continuation of U.S. patent application Ser. No. 16/853,045, filed on Apr. 20, 2020, which claims priority to Japanese Patent Application No. 2019-081379, filed on Apr. 22, 2019, the disclosure of which is hereby incorporated by reference in its entirety.

BACKGROUND

The present invention relates to a wavelength conversion part, a method of manufacturing a wavelength conversion part, and a light emitting device having a wavelength conversion part.

Japanese Patent Publication No. 2019-9406 discloses an optical part integrally forming a phosphor-containing light transmitting member and a light reflecting member that surrounds the light transmitting member. It also discloses that this optical part is formed by integrally sintering a light transmitting member and a light reflecting member, each made primarily of a ceramic material. It also discloses an embodiment of a light emitting device in which the optical part is disposed on a heat dissipating member.

SUMMARY

From a heat dissipation perspective, however, optical parts such as those disclosed by the above patent publication have room for improvement.

According to one embodiment, a wavelength conversion part includes a wavelength conversion member formed primarily of a ceramic material, an enclosing member formed primarily of a ceramic material and surrounding the lateral faces of the wavelength conversion member, and a heat dissipating member whose upper face opposing and fixed to the lower faces of the wavelength conversion member and the enclosing member, wherein the lower face of the wavelength conversion member projects more towards the heat dissipating member than the lower face of the enclosing member.

According to another embodiment, a light emitting device includes semiconductor laser elements, a base having a bottom face on which the semiconductor laser elements are disposed and a frame portion that surrounds the semiconductor laser elements, and a wavelength conversion part disclosed in the description herein disposed above the semiconductor laser elements, wherein the heat dissipating member in the wavelength conversion part has a light transmitting region through which the light from the semiconductor laser elements passes, and the light passing through the light transmitting region enters the wavelength conversion member in the wavelength conversion part.

According to another embodiment, a method of manufacturing a wavelength conversion part includes preparing an integral sintered body in which a wavelength conversion member and an enclosing member, each made primarily of a ceramic material and having a different void content, are secured together, and grinding the lower face of the integral sintered body such that the wavelength conversion member projects more than the enclosing member at the lower face.

Certain embodiments of the present disclosure provide a wavelength conversion part that excels in heat dissipation, as well as a light emitting device that excels in heat dissipation, and a method of manufacturing the same.

DETAILED DESCRIPTION

Figure 1:
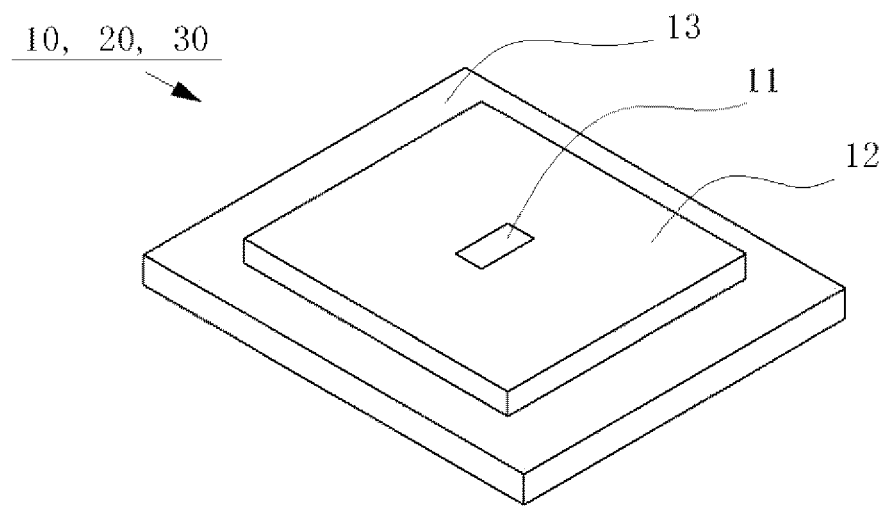
FIG. 1 is a perspective view of a wavelength conversion part according to first to third embodiments.

In the description or the scope of claims herein, when describing a structure or shape as a polygonal shape, such as a triangle, quadrangle, or the like, any of those shapes subjected to processing such as cutting angles, chamfering, beveling, rounding, or the like will be included to that being referred to as a polygon. Similarly, a polygonal shape subjected to processing not only at a corner, but also in the middle of a side will also be referred to as a polygonal shape. In other words, any polygon-based shape subjected to processing is included in the interpretation of a "polygon" disclosed in the description and the scope of claims herein.

This applies to not only polygons, but also any word that describes a specific shape, such as a trapezoidal, circular, recessed, or projected shape. This also applies when handling each side of a shape. In other words, even if a side is subjected to processing at a corner or in the middle, the interpretation of a "side" includes the processed portion. In the case of distinguishing a "polygon" or "side" that has been intentionally not processed from a processed shape, it will be expressed with the word, "strict sense," added thereto, for example, a "strict sense quadrangle."

In the description or the claims section herein, moreover, when there are multiple pieces of a certain component and a distinction must to be made, a word such as "first," "second," or the like might occasionally be added. The manner in which such a word is used in the description might not match the manner in which such a word is used in the scope of the claims section if the subject to be distinguished or the perspective for such a distinction differs.

Certain embodiments of the present invention will be explained below with reference to the drawings. The embodiments described below are provided to give shape to the technical ideas of the present invention, and are not intended to limit the present invention. In the explanation below, the same designations and reference numerals denote the same or similar members, for which a redundant explanation will be omitted as appropriate. The sizes of and relative positions of the members shown in the drawings might be exaggerated for clarity of explanation.

Wavelength Conversion Part According to First Embodiment

Figure 2:
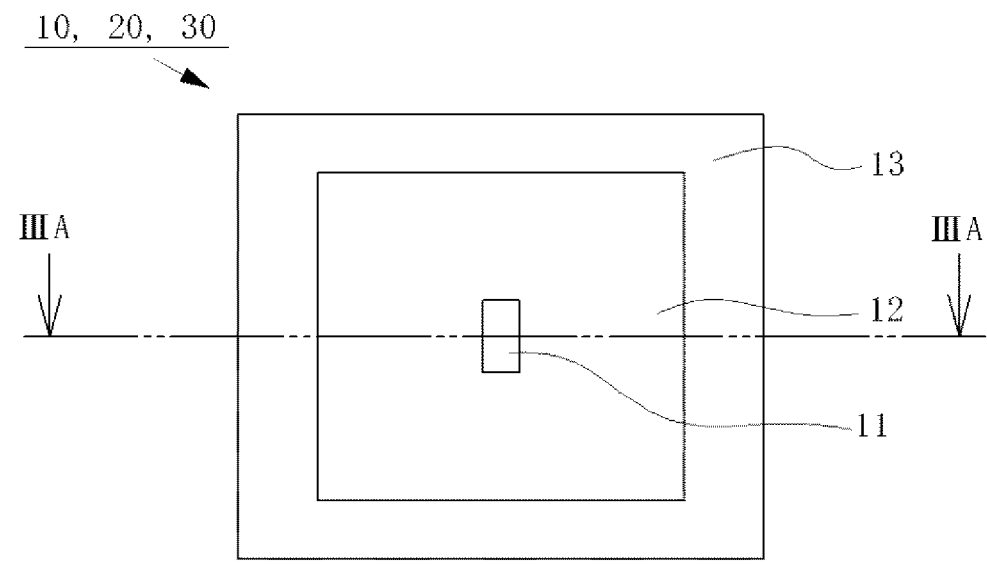
FIG. 2 is a top view corresponding to FIG. 1.
Figure 3A:
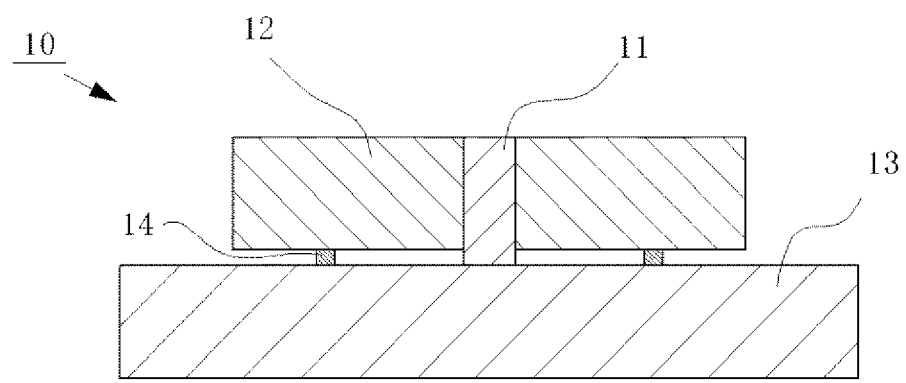
FIG. 3A is a cross-sectional view of the wavelength conversion part according to the first embodiment taken along line IIIA-IIIA in FIG. 2.
Figure 3B:
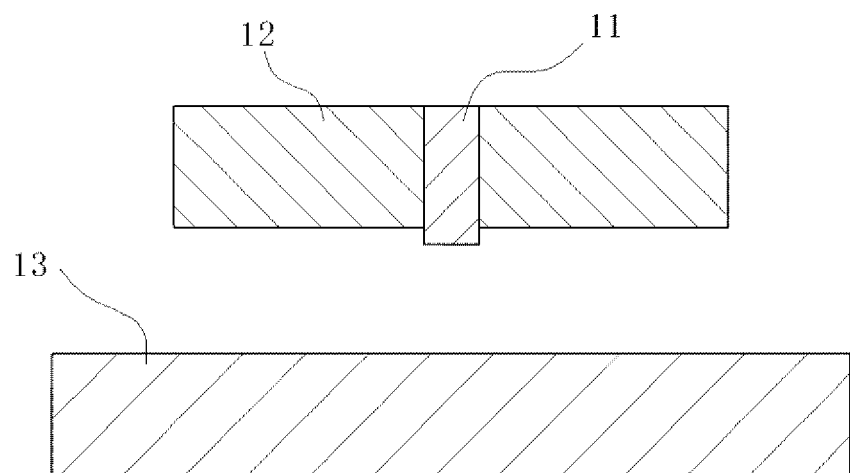
FIG. 3B is a cross-sectional view prior to fixing the composite member to the heat dissipating member in wavelength conversion part according to the first embodiment.

FIG. 1 is a perspective view of a wavelength conversion part 10 according to a first embodiment. FIG. 2 is a top view of the wavelength conversion part 10. FIG. 3A is a cross-sectional view of the wavelength conversion part 10 taken along line IIIA-IIIA in FIG. 2. FIG. 3B is a cross-sectional view prior to fixing the composite member to the heat dissipating member 13.

The wavelength conversion part 10 includes a wavelength conversion member 11, an enclosing member 12, a heat dissipating member 13, and an adhesive 14.

The wavelength conversion member 11 has an upper face, a lower face, and one or more lateral faces. In this embodiment, the wavelength conversion member 11 is formed in a shape of a rectangular cuboid. However, the shape is not limited to a rectangular cuboid. The upper face and the lower face do not have to be rectangular. The upper face and the lateral faces do not have to be planes. The lower face is preferably a plane.

The wavelength conversion member 11 converts the light entering the wavelength conversion member 11 into light having a different wavelength from the entering light. An inorganic material can be used as a primary material for the wavelength conversion member 11. Inorganic materials are less prone to decomposition by irradiated light, and thus are preferable. The primary material does not have to be an inorganic material.

Specifically, the wavelength conversion member 11 can be formed primarily of a ceramic material as a primary material, and contain a phosphor. Specific examples of primary materials include aluminum oxide. Yttrium oxide, zirconium oxide, aluminum nitride or the like may be used as the primary material. Alternatively, the wavelength conversion member 11 may be formed by using glass as a primary material, or a single crystal phosphor.

Examples of phosphors include yttrium aluminum garnet (YAG) activated by cerium, lutetium aluminum garnet (LAG) activated by cerium, nitrogen-containing calcium aluminosilicate ($CaO-Al_2O_3-SiO_2$) activated by europium and/or chromium, silicate ($(Sr,Ba)_2SiO_4$) activated by europium, $\alpha$-SiAlON phosphors, and $\beta$-SiAlON phosphors. Among all, a YAG phosphor that is highly heat resistant is preferably used. The wavelength conversion member 11 may contain not only one type of phosphor, but also two or more types of phosphors.

The enclosing member 12 has an upper face, a lower face, one or more outer lateral faces, and one or more inner lateral faces. The enclosing member 12 is formed as a rectangular cuboid plate having a through hole in the central portion of the outer shape. One or more lateral faces defining the through hole constitute the one or more inner lateral faces. The outer shape is not limited to a rectangular cuboid. The shape of the through hole depends on the shape of the wavelength conversion member 11, and the shape of the one or more inner lateral faces depends on the shape of the one or more lateral faces of the wavelength conversion member 11. The upper face and lateral faces do not have to be planes. The lower face is preferably a plane.

A ceramic material can be used as a primary material for the enclosing member 12. Specifically, for example, aluminum oxide can be used. Aluminum nitride, silicon nitride, silicon carbide, zirconium oxide, titanium oxide, or the like may alternatively be used. The primary material to be used is not limited to these, and a metal, ceramic metal composite, or the like may be used.

A reflective material is preferably used as a primary material for the enclosing member 12. For the reflective material, for example, aluminum oxide can be used. Zirconium oxide, titanium oxide, or the like, may alternatively be used. The enclosing member may contain, in addition to the primary material, an additive made of a different material from the primary material that functions to reduce light transmittance. Examples of additives include yttrium oxide, zirconium oxide, boron nitride, lutetium oxide, lanthanum oxide, and the like.

In the case of forming a highly reflective enclosing member 12 in this manner, the enclosing member 12 can be considered as a light reflecting member. Being highly reflective is defined as having a light reflectance of 80% to 100%.

The heat dissipating member 13 has an upper face, a lower face, and one or more lateral faces. The heat dissipating member 13 is formed as a rectangular cuboid plate. The outer shape is not limited to a rectangular cuboid. The lower face and the lateral faces do not have to be planes. The upper face is preferably a plane.

For the heat dissipating member 13, for example, sapphire can be used as a primary material. Quartz, silicon carbide, or glass may alternatively be used. Moreover, a light transmissive material can be used as a primary material for the heat dissipating member 13. In this case, the heat dissipating member 13 preferably has a light transmitting region from the upper face to the lower face. Being light transmissive here is defined as transmitting at least 80% of incident light. Specifically, sapphire can be used as a light transmissive material.

For the adhesive 14, for example, a metal adhesive such as Au—Sn can be used. The adhesive that can be used is not limited to this, and a resin adhesive primarily composed of a curable resin or a ceramic-based adhesive can be used.

Alternatively, by using glass for the adhesive 14, the enclosing member 12 and the heat dissipating member 13 may be fused to glass.

Next, one example of a method of manufacturing a wavelength conversion part 10 will be explained. The wavelength conversion part 10 can be manufactured by the processes described below, for example.

First, a wavelength conversion member 11 and an enclosing member 12 are fixed to one another such that the one or more lateral faces of the wavelength conversion member 11 are in contact with the one or more inner lateral faces of the enclosing member 12. Here, the wavelength conversion member 11 and the enclosing member 12 are fixed to one another as a sintered body by integrally sintering the wavelength conversion member 11 and the enclosing member 12.

For the wavelength conversion member 11, a phosphor ceramic having a phosphor portion and a light transmissive portion is used. The phosphor portion is composed of a YAG-based phosphor, and the light transmissive portion contains aluminum oxide as a primary material. For the enclosing member 12, a ceramic material composed of aluminum oxide is used as a primary material and yttrium oxide as an additive.

A sintered body integrating a wavelength conversion member 11 and an enclosing member 12 (hereinafter referred to as an integral sintered body) can be formed by forming a wavelength conversion member 11 by sintering followed by sintering it after disposing a powder material for the enclosing member 12 in the surrounding of the wavelength conversion member 11.

The process is not limited to this. The integral sintered body of the wavelength conversion member 11 and the enclosing member 12 may be formed using a different process, such as by forming an enclosing member 12 by sintering followed by sintering it after disposing a powder material for the wavelength conversion member 11. For sintering, for example, spark plasma sintering (SPS), hot press sintering (HP), pressureless sintering, gas pressure sintering, or the like can be used.

The integral sintered body is formed to have a plate shape. The one or more lateral faces of the wavelength conversion member 11 are surrounded by the one or more inner lateral faces of the enclosing member 12, but the upper face and the lower face of the wavelength conversion member 11 as well as the upper face and the lower face of the enclosing member 12 are exposed. Alternatively, the upper face and/or the lower face of the wavelength conversion member 11 may be surrounded by the enclosing member 12. In this case, the upper face and the lower face of the wavelength conversion member 11 will subsequently be exposed from the enclosing member 12 by grinding or the like.

The thickness of the integral sintered body from the upper face to the lower face is adjusted to be at least 100 µm, but 1000 µm at most. The wavelength conversion member 11 and the enclosing member 12 have the same thickness. In the case of manufacturing a larger wavelength conversion part 10, the thickness does not have to fall within this thickness range.

The wavelength conversion member 11 and the enclosing member 12 are of the same ceramic sintered body, but the wavelength conversion member 11 has a higher density than that of the enclosing member 12. Furthermore, the average particle size of the primary material for forming the sintered body is larger for the wavelength conversion member 11 than the enclosing member 12. Moreover, the void content of the wavelength conversion member 11 is smaller than that of the enclosing member 12. Furthermore, the wavelength conversion member 11 has a higher strength than the enclosing member 12. The wavelength conversion member 11 and the enclosing member 12 preferably satisfy one or more of these relative magnitude relations, and may satisfy all of the relative magnitude relations.

Adjusting sintering conditions, such as temperature, pressure, and heat treatment duration, for example, can create the differences (the relative magnitude relations) described above between the wavelength conversion member 11 and the enclosing member 12. For example, lowering the pressure allows a sintered body to readily contain voids thereby increasing the void content (the porosity of the sintered body). Sintering at a high temperature in a short heat treatment duration can reduce particle size, thereby reducing the average particle size.

The wavelength conversion member 11 is formed to have a void content in a range of 0% to 5%. Moreover, the enclosing member 12 is formed to have a void content in a range of 5% to 15%. Furthermore, the wavelength conversion member 11 has a smaller void content than that of the enclosing member 12 by at least 5%. The void content at the contact surfaces between the wavelength conversion member 11 and the enclosing member 12, i.e., the regions near the one or more lateral faces of the wavelength conversion member 11, is smaller than that of the regions near the one or more inner lateral faces of the enclosing member 12 by at least 5%. The void contents of the wavelength conversion member 11 and the enclosing member 12 can be measured, for example, by the Archimedes method.

Next, a process is performed to allow the wavelength conversion member 11 to project more than the enclosing member 12 at the lower face. Here, the wavelength conversion member 11 can be made to project more than the enclosing member 12 by grinding the lower face of the integral sintered body.

Using a binder, abrasive grains are bonded to a grinding wheel against which the integral sintered body is pressed for grinding. For example, diamond abrasive grains and a resinoid binder can be used. The wavelength conversion member 11 and the enclosing member 12 have different strengths because their void contents differ. When subjected to grinding, the wavelength conversion member 11 and the enclosing member 12 are ground in different degrees because they have different strengths, thereby grinding the enclosing member 12 deeper. A resinoid binder does not bond the abrasive grains too tightly, and thus can effectively grind the wavelength conversion member 11 and the enclosing member 12 to different degrees.

The lower face of the wavelength conversion member 11 projects more than the lower face of the enclosing member 12 near the inner lateral face of the enclosing member 12 by 150 nm to 500 nm. The lower face of the wavelength conversion member 11 projects more than the lower face of the enclosing member in the region from the inner lateral face of the enclosing member 12 to halfway between the inner lateral face and the outer lateral face by 150 nm to 500 nm. The areas near the one or more outer lateral faces of the enclosing member 12 that are most susceptible to warping are excluded from the projection comparison.

In this manner, a composite member consisting of the wavelength conversion member 11 and the enclosing member 12 in which the wavelength conversion member 11 is projected more than the enclosing member 12 at the lower face (see FIG. 3A) can be formed.

In place of the process of fixing the wavelength conversion member 11 to the enclosing member 12, a process may be performed to provide a composite member (integral sintered body) in which a wavelength conversion member 11 and an enclosing member 12 are fixed. Moreover, in place of the process of allowing one member to project after the fixing process, a process may be performed to fix a wavelength conversion member 11 to an enclosing member 12 so as to allow the wavelength conversion member 11 to project more than the enclosing member 12 at the lower face.

At any rate, a process of forming a composite member is performed such that the wavelength conversion member 11 and the enclosing member 12 are fixed to one another, and the wavelength conversion member 11 projects more than the enclosing member 12 at the lower face.

The upper face of the integral sintered body may be ground in addition to the lower face. Similar to the lower face, the wavelength conversion member 11 can project more than the enclosing member 12 at the upper face. It may be adapted to not allow the wavelength conversion member 11 to project at the upper face by employing different grinding conditions for the upper face from those for the lower face. For example, instead of a resin bond (resinoid) for the bonding agent, a metal bond or vitrified bond grinding wheel may be used for grinding the surface.

At any rate, the one or more lateral faces of the wavelength conversion member 11 are almost entirely in contact with the one or more inner lateral faces of the enclosing member 12, and the one or more inner lateral faces of the enclosing member 12 are almost entirely in contact with the one or more lateral faces of the wavelength conversion member 11. "Almost entirely" can be defined by using a range in a range of 95% to 100%, for example. The one or more lateral faces of the two members being in contact in this range is referred to as the major portions of the one or more lateral faces of the two members being in contact.

Then the composite member and a heat dissipating member 13 are fixed to one another such that the lower faces of the wavelength conversion member 11 and the enclosing member 12 oppose the upper face of the heat dissipating member 13. Here, the composite member is fixed to the heat dissipating member 13 by disposing an adhesive 14 between the lower face of the enclosing member 12 and the upper face of the heat dissipating member 13. When the composite member is fixed to the heat dissipating member 13, the lower face of the wavelength conversion member 11 projects towards the heat dissipating member 13 more than the lower face of the enclosing member 12.

From a heat dissipation perspective, the composite member and the heat dissipating member 13 are bonded while abutting the lower face of the wavelength conversion member 11 to the upper face of the heat dissipating member 13. For this purpose, the adhesive 14 is used in a thickness of the fixed adhesive 14 not exceeding the distance of the projected portion of the wavelength conversion member 11 from the enclosing member 12. A wavelength conversion part 10 can be manufactured in this manner (see FIG. 3B).

It is not necessary to abut the lower face of the wavelength conversion member 11 against the upper face of the heat dissipating member 13. Even in this case, allowing the wavelength conversion member 11 to project from the enclosing member 12 can produce a wavelength conversion part 10 capable of excelling in heat dissipation.

The wavelength conversion part 10 according to the first embodiment can shorten the distance between the wavelength conversion member 11 and the heat dissipating member 13 by fixing the wavelength conversion member 11 having a projected portion to the heat dissipating member 13, thereby achieving good heat dissipation properties.

Wavelength Conversion Part According to Second Embodiment

Figure 4A:
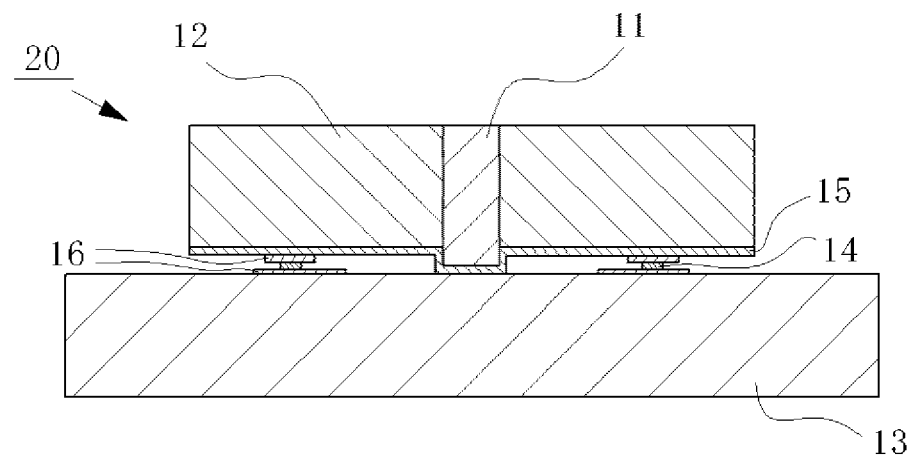
FIG. 4A a cross-sectional view of the wavelength conversion part according to the second embodiment taken at the same location as the line IIIA-IIIA in FIG. 2.
Figure 4B:
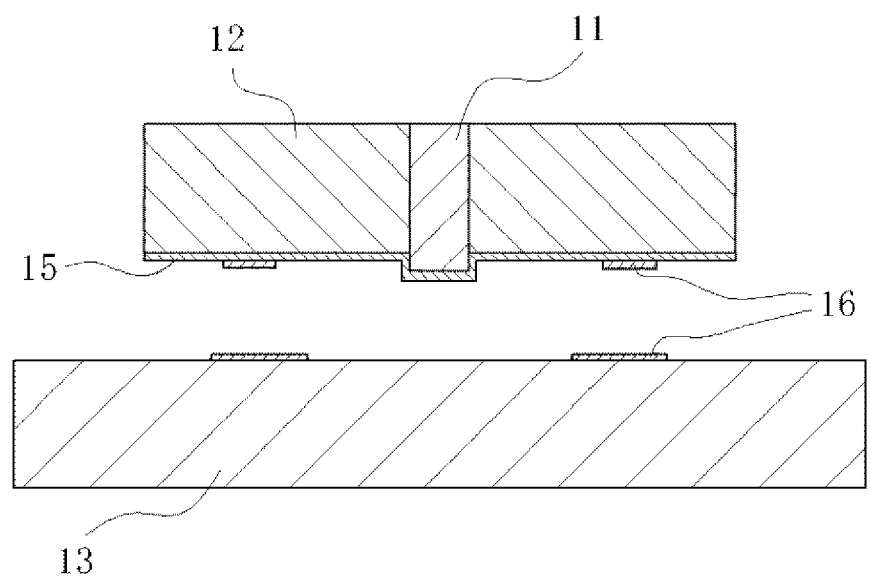
FIG. 4B is a cross-sectional view prior to fixing the composite member to the heat dissipating member in the wavelength conversion part according to the second embodiment.

A wavelength conversion part according to a second embodiment will be explained next. The wavelength conversion part 20 according to the second embodiment has a perspective view similar to FIG. 1. The top view of the wavelength conversion part 20 is similar to FIG. 2. FIG. 4A is a cross-sectional view of the wavelength conversion part 20 taken along the same position as line IIIA-IIIA in FIG. 2. FIG. 4B is a cross-sectional view prior to fixing the composite member to the heat dissipating member 13.

The wavelength conversion part 20 is different from the wavelength conversion part 10 by further having an optical film 15 and a conducting member 16.

The optical film 15 achieves certain effective operations on light. Operations are related to optical characteristics such as reflection, transmission, anti-reflection, light shielding, and the like. The optical characteristics achieved by the optical film 15 are not limited to these.

Effective operations refer to a reflectance of 80% to 100% in terms of reflection, a transmittance of 90% to 100% in terms of transmission, a reflectance of 0% to 10% in terms of anti-reflection, and a transmittance of 0% to 5% in terms of light shielding. The reflectance and transmittance described above refer to those achieved on the wavelengths of light targeted by the optical film 15.

The optical film 15 may be one that can achieve certain effective operations only on the light of a specific wavelength range. Alternatively, it may be one that can be effective on multiple appropriate optical characteristics. For example, the optical film 15 may have an effective reflection on the light of a specific wavelength range while having an effective transmission on the light of a wavelength range different from the specific wavelength range.

The optical film 15 is made of a multilayer dielectric film formed by stacking multiple dielectric layers. It may be a single layer film instead of a multilayer film. It does not have to be a dielectric layer. For dielectric layers, silicon oxide, niobium oxide, aluminum oxide, aluminum nitride, titanium oxide, tantalum oxide, or the like can be employed. A multilayer dielectric film for a purpose can be formed by suitably combining these.

The conducting member 16 is a metal film disposed for electrical connection. For the metal film, for example, Ti/Pt/Au (metal films stacked in the order of Ti, Pt, and Au) can be used. It is not limited to this, and for example, Ni or Cr in place of Ti, and Ru in place of Pt, can be used.

One example of a method of manufacturing a wavelength conversion part 20 will be explained next. The method of manufacturing a wavelength conversion part 20 differs from the method of manufacturing a wavelength conversion part 10 by further including disposing an optical film 15 on the lower face of the composite member, disposing a conducting member 16 on the lower face of the enclosing member 12 in the composite member and on the upper face of the heat dissipating member 13, and, in the process of fixing the composite member to the heat dissipating member 13, electrically connecting the conducting member 16 disposed on the enclosing member 12 and the conducting member 16 disposed on the heat dissipating member 13 using an adhesive 14.

The process of disposing an optical film 15 on the lower face of the composite member is performed after forming the composite member in which the wavelength conversion member 11 projects more than the enclosing member 12 at the lower face. The optical film 15 is disposed on the lower face of the wavelength conversion member 11. The optical film 15 is also disposed on the lower face of the enclosing member 12. The optical film may be disposed only on one of the wavelength conversion member 11 and the enclosing member 12.

In the process of disposing a conducting member 16 on the lower face of the enclosing member 12 in the composite member and on the upper face of the heat dissipating member 13, the conducting member 16 is disposed on the lower face of the enclosing member 12 after the optical film 15 is formed on the composite member. The conducting member 16 is also disposed on the upper face of the heat dissipating member 13. Alternatively, a heat dissipating member 13 having a conducting member 16 predisposed thereon may be provided.

The conducting members 16 on the enclosing member 12 and the conducting members 16 on the heat dissipating member 13 are disposed so as to partially or entirely overlap when viewed from the top or the bottom in state that the composite member is fixed to the heat dissipating member 13. In the process of fixing a composite member to a heat dissipating member 13, the adhesive 14 is disposed in the overlapping region to fix the composite member to the heat dissipating member 13. The adhesive 14 including a conductive material such as a metal adhesive is used.

The wavelength conversion part 20 according to the second embodiment having an optical film 15 is a wavelength conversion part capable of achieving certain optical effects. By achieving conduction without disposing a conducting member 16 between the wavelength conversion member 11 and the heat dissipating member 13, the heat generated at the wavelength conversion member 11 can be appropriately dissipated.

The wavelength conversion part 20 has a conducting member 16, but even if a member other than the conducting member 16 is employed, it is preferable to similarly interpose the member between the enclosing member 12 and the heat dissipating member 13 instead of interposing it between the wavelength conversion member 11 and the heat dissipating member 13. The conducting member 16 is one example of a member interposed between the composite member and the heat dissipating member 13. In the wavelength conversion part, the interposed member is located between the enclosing member 12 and the heat dissipating member 13, not between the wavelength conversion member 11 and the opposing heat dissipating member 13.

The lower face of the wavelength conversion member 11 abutting the upper face of the heat dissipating member 13 includes those cases in which the lower face of the wavelength conversion member 11 abuts the upper face of the heat dissipating member 13 via a thin film. A thin film here refers to a member having a thickness of 5.0 μm at most. In the wavelength conversion part 20, a thin optical film 15 is disposed, and the lower face of the wavelength conversion member 11 is abutted and bonded to the upper face of the heat dissipating member 13. The lower face of the wavelength conversion member 11 does not have to abut the upper face of the heat dissipating member 13.

The wavelength conversion member 11 projecting more than the enclosing member 12 at the lower face in the case in which the optical member 15 is disposed only on the enclosing member 12 means that the wavelength conversion member 11 projects more than the optical film 15 disposed on the enclosing member 12. Similar to the first embodiment, the areas near the outer lateral faces of the enclosing member 12 are excluded from the projection comparison as they are most susceptible to warping.

Wavelength Conversion Part According to Third Embodiment

Figure 5A:
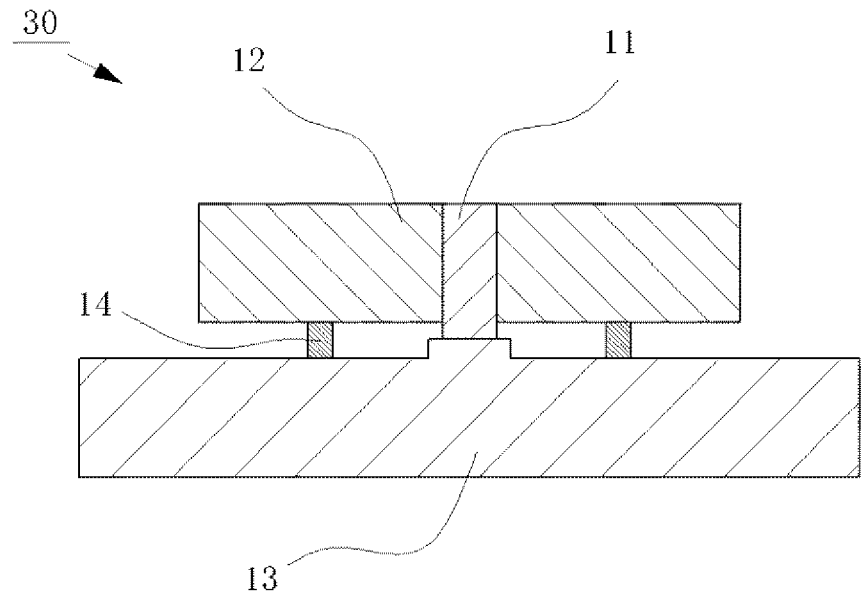
FIG. 5A a cross-sectional view of the wavelength conversion part according to the third embodiment taken along the same location as the line IIIA-IIIA in FIG. 2.
Figure 5B:
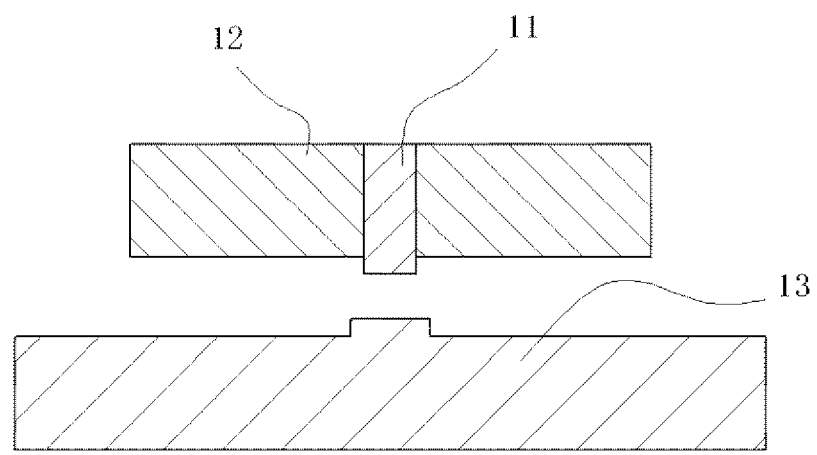
FIG. 5B is a cross-sectional view prior to fixing the composite member to the heat dissipating member in the wavelength conversion part according to the third embodiment.

A wavelength conversion part according to a third embodiment will be explained next. FIG. 1 is a perspective view of the wavelength conversion part 30 according to the third embodiment. FIG. 2 is a top view of the wavelength conversion part 30. FIG. 5A is a cross-sectional view of the wavelength conversion part 30 taken along the same location as line IIIA-IIIA in FIG. 2. FIG. 5B is a cross-sectional view prior to fixing the composite member to the heat dissipating member 13.

The wavelength conversion part 30 differs from the wavelength conversion part 10 in that the shape of the heat dissipating member 13 is different. In the wavelength conversion part 30, the heat dissipating member 13 has a projected portion on the upper face side. The projected portion is located in the central portion.

One example of a method of manufacturing a wavelength conversion part 30 will be explained next. The method of manufacturing the wavelength conversion part 30 differs from the method of manufacturing a wavelength conversion part 10 in that, in fixing the composite member to the heat dissipating member 13, the members are arranged so that the lower face of the wavelength conversion member 11 in the composite member partially or entirely overlaps the upper face of the projected portion (the projected upper face) of the heat dissipating member 13 when viewed from the top or the bottom.

Moreover, the members are arranged such that the upper face of the projected portion of the heat dissipating member 13 covers the lower face of the wavelength conversion member 11. The lower face of the wavelength conversion member 11 is abutted and fixed to the upper face of the projected portion of the heat dissipating member 13.

The wavelength conversion part 30 according to the third embodiment having a projected portion in the heat dissipating member 13 allows the wavelength conversion member 11 to more securely abut the heat dissipating member 13 even if warping has occurred in the vicinity of the lateral faces of the heat dissipating member 13, thereby achieving excellent heat dissipation properties.

Wavelength Conversion Part According to Fourth Embodiment

Figure 6:
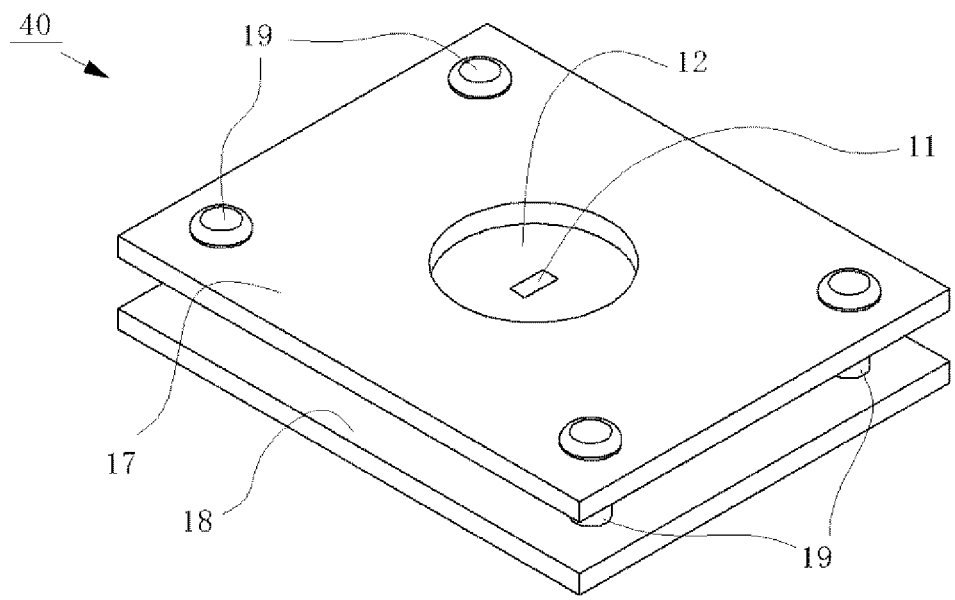
FIG. 6 is a perspective view of a wavelength conversion part according to a fourth embodiment.
Figure 7:
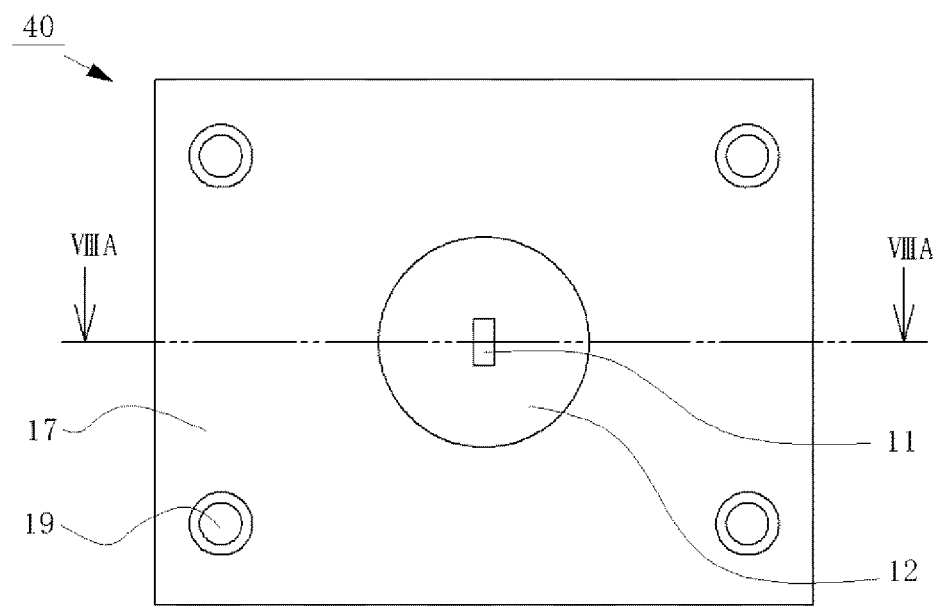
FIG. 7 is a top view corresponding to FIG. 6.
Figure 8A:
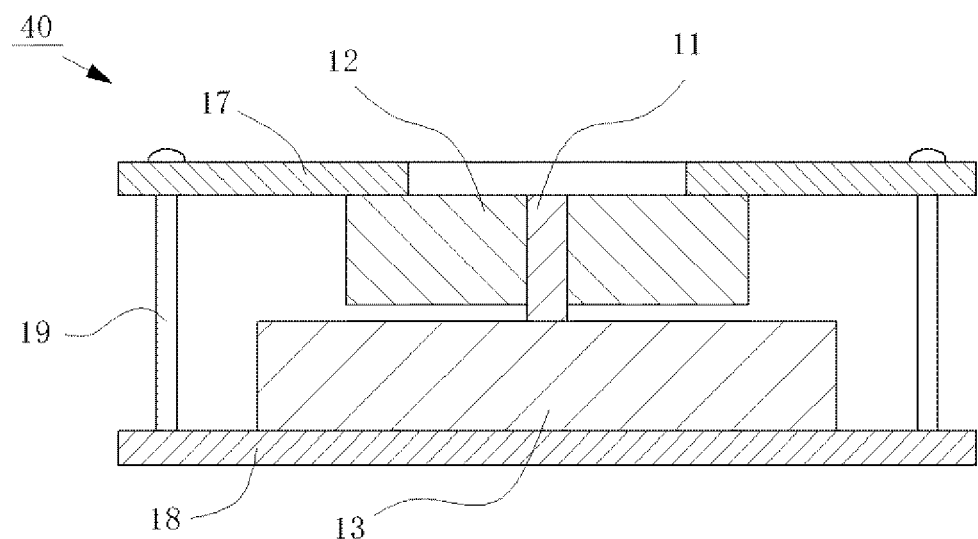
FIG. 8A is a cross-sectional view of the wavelength conversion part according to the fourth embodiment taken along line VIIIA-VIIIA in FIG. 7.
Figure 8B:
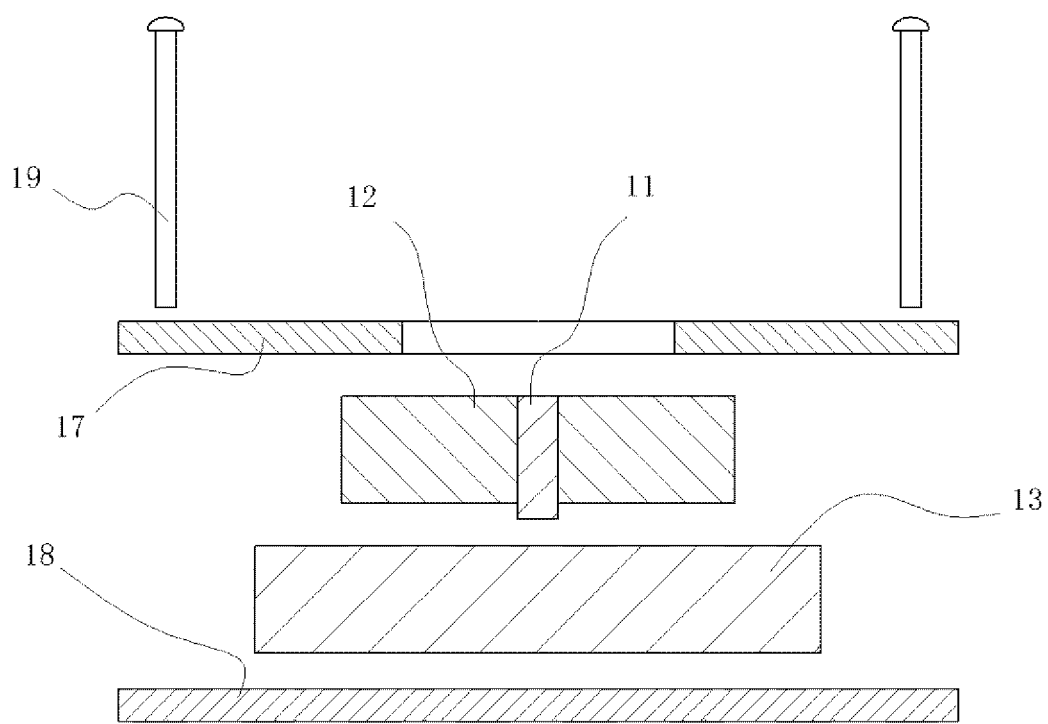
FIG. 8B is a cross-sectional view prior to fixing the composite member to the heat dissipating member in the wavelength conversion part according to the fourth embodiment.

A wavelength conversion part according to a fourth embodiment will be explained next. FIG. 6 is a perspective view of the wavelength conversion part 40 according to the fourth embodiment. FIG. 7 is a top view of the wavelength conversion part 40. FIG. 8A is a cross-sectional view of the wavelength conversion part 40 taken along VIIIA-VIIIA in FIG. 7. FIG. 8B is a cross-sectional view prior to fixing the composite member to the heat dissipating member 13.

The wavelength conversion part 40 differs from the wavelength conversion part 10 by having an upper holding member 17, a lower holding member 18, and fasteners 19. It differs from the wavelength conversion part 10 in that the composite member is fixed to the heat dissipating member 13 by using the upper holding member 17, the lower holding member 18 and the fasteners 19 in place of an adhesive 14.

The upper holding member 17 has an upper face, a lower face, and an inner lateral face. The upper holding member 17 has a shape of a rectangular cuboid plate with a circular through hole in the central portion when viewed from the top. The lateral face defining the through hole constitutes the inner lateral face. The outer shape is not limited to a rectangular cuboid. The through hole shape is not limited to a circle. Moreover, the upper holding member 17 has fastener holes penetrating from the upper face to the lower face at four corners when viewed from the top.

The lower holding member 18 has a lower face, an upper face, and lateral faces. The lower holding member 18 has a shape of a rectangular cuboid plate. The outer shape is not limited to a rectangular cuboid. The lower holding member 18 also has fastener holes at four corners when viewed from the top. The fastener holes do not penetrate through the lower face. They may penetrate from the upper face to the lower face.

A metal can be used as a primary material for the upper holding member 17 and the lower holding member 18. A material having a high thermal conductivity is preferably employed, and a metal such as copper, aluminum, or the like can be used. The primary material does not have to be a metal.

The fasteners 19 are screws, for example, and in this case, the fastener holes in the upper holding member 17 and the lower holding member 18 would be screw holes.

One example of a method of manufacturing a wavelength conversion part 40 will be explained next. The method of manufacturing a wavelength conversion part 40 differs from the method of manufacturing a wavelength conversion part 10 in that, in the process of fixing the composite member to the heat dissipating member 13, the members are fixed by securing the upper holding member 17 and the lower holding member 18 using the fasteners 19.

In the process of fixing the composite member to the heat dissipating member 13, no adhesive is used, and the composite member and the heat dissipating member 13 are pressed together from the top and the bottom to be fixed using fasteners. Accordingly, the lower face of the wavelength conversion member 11 abuts the upper face of the heat dissipating member 13.

Using holding members to secure the wavelength conversion part 40 according to the fourth embodiment can simplify tasks such as replacing a composite member or a heat dissipating member 13 by removing the fasteners 19. The wavelength conversion member 11 abuts the heat dissipating member 13, thereby achieving a wavelength conversion part having excellent heat dissipation properties.

Several embodiments of a wavelength conversion part have been explained, but the wavelength conversion part is not limited to these embodiments in a strict sense. For example, a wavelength conversion part 10 according to the first embodiment may employ a component or process from any of the second to fourth embodiments. A wavelength conversion part according to one of the first to fourth embodiments may employ any of the components or processes disclosed in any other embodiment in part or whole. For example, a wavelength conversion part may be one based on the wavelength conversion part 40 according to the fourth embodiment that has a heat dissipating member with a projected portion according to the third embodiment.

Light Emitting Device Embodiment

Figure 9:
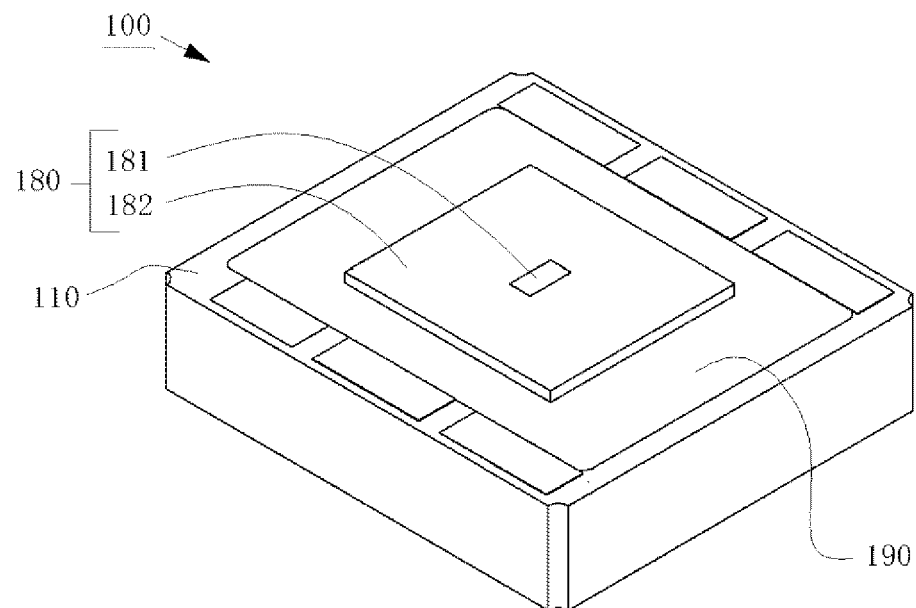
FIG. 9 is a perspective view of a light emitting device according to one embodiment.
Figure 10:
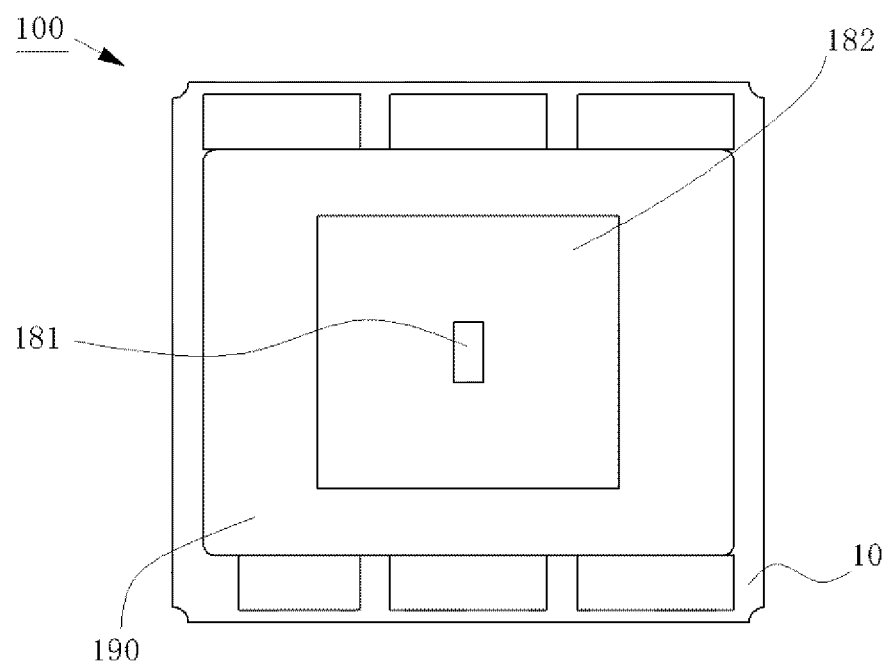
FIG. 10 is a top view corresponding to FIG. 9.
Figure 11:
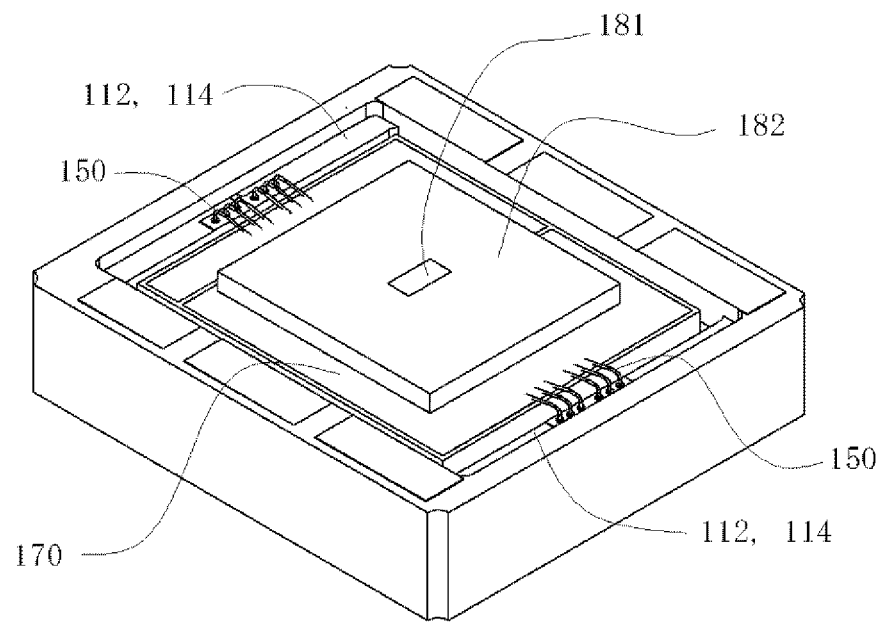
FIG. 11 is a perspective view explaining the internal structure of the light emitting device according to the embodiment.
Figure 12:
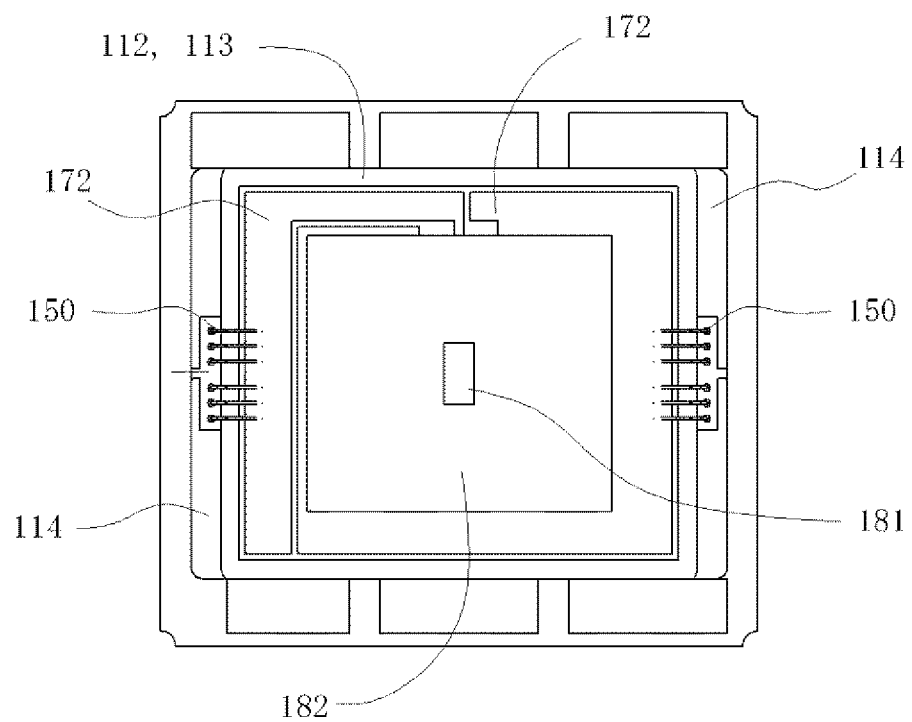
FIG. 12 is a top view corresponding to FIG. 11.
Figure 13:
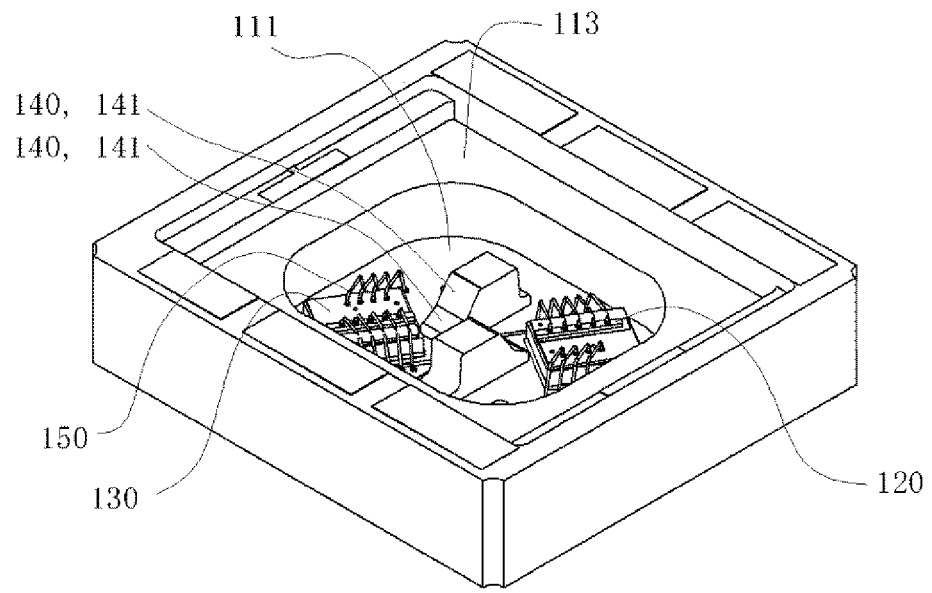
FIG. 13 is a perspective view explaining the internal structure of the light emitting device according to the embodiment.
Figure 14:
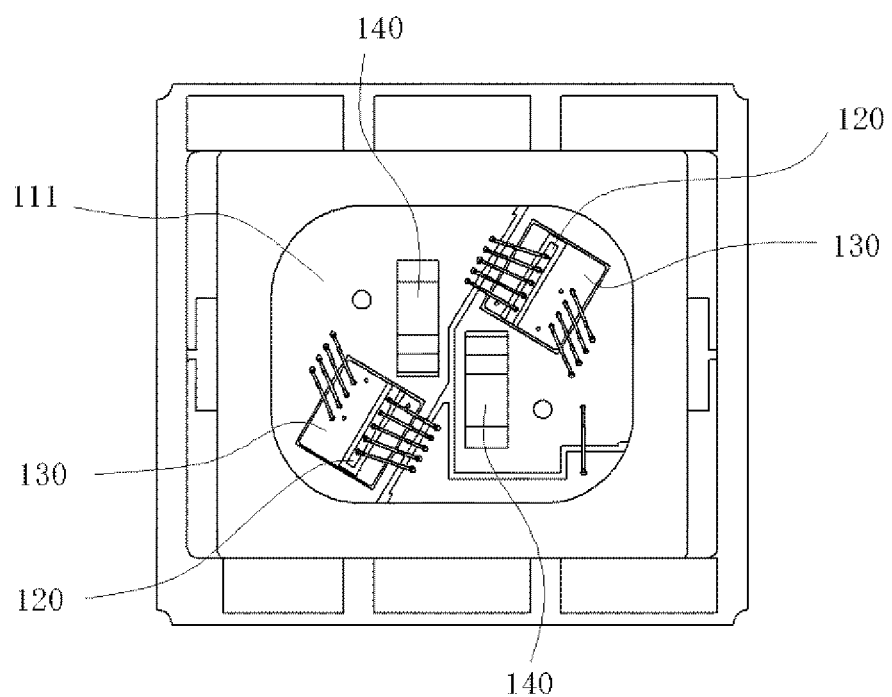
FIG. 14 is a top view corresponding to FIG. 13.
Figure 15A:
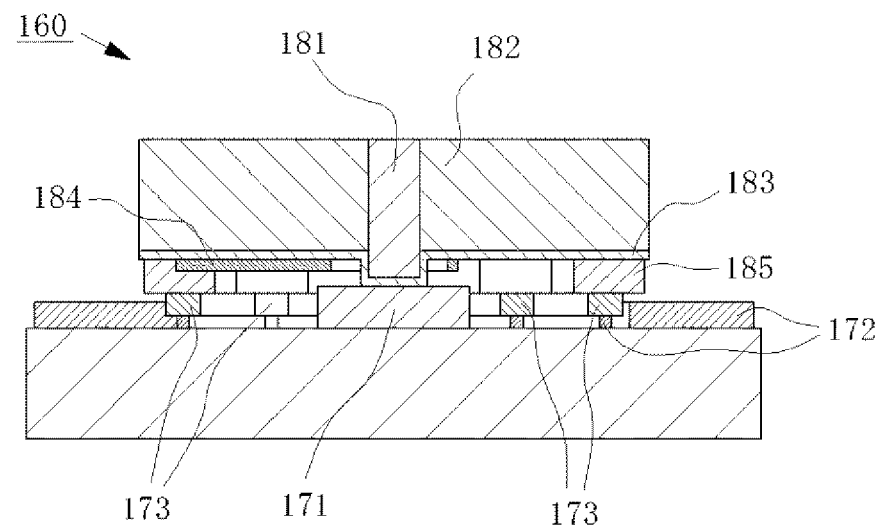
FIG. 15A is a cross-sectional view of the wavelength conversion part in the light emitting device according to the embodiment.
Figure 15B:
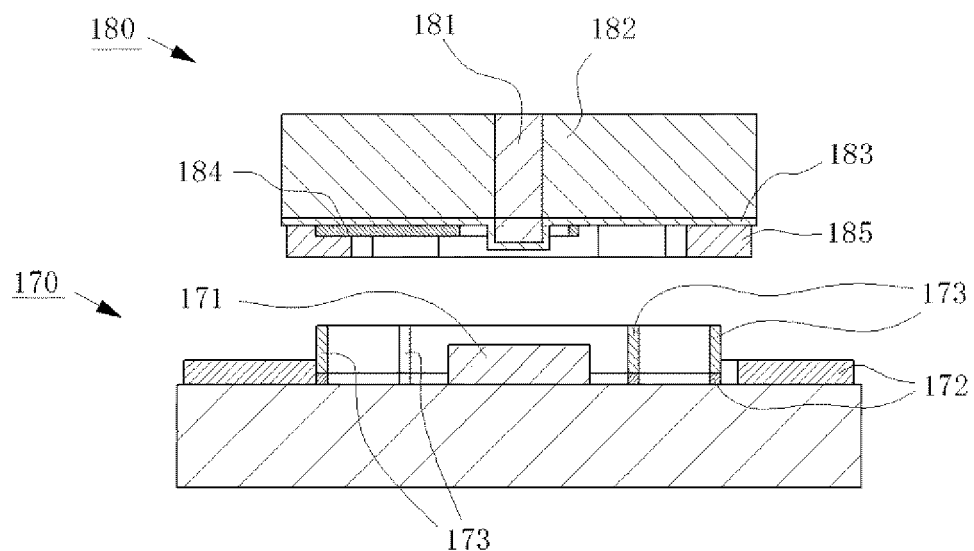
FIG. 15B is an exploded view showing the components of the wavelength conversion part in the light emitting device according to the embodiment.

One embodiment of a light emitting device having the wavelength conversion part will be explained next as an example. FIG. 9 is a perspective view of the light emitting device 100 according to the embodiment. FIG. 10 is a top view of the light emitting device 100. FIG. 11 is a perspective view of the light emitting device 100 from which a light shielding member 190 is removed to explain the internal structure. FIG. 12 is a top view of the device in the same state as in FIG. 11. FIG. 13 is a perspective view of the light emitting device 100 further removing the wavelength conversion part 160 to explain the internal structure. FIG. 14 is a top view of the device in the same stat as in FIG. 13. FIG. 15A is a cross-sectional view of the wavelength conversion part 160, and FIG. 15B is an exploded view of the wavelength conversion part 160.

The light emitting device 100 includes a base 110, two semiconductor laser elements 120, two submounts 130, two light reflecting members 140, wirings 150, a wavelength conversion part 160 and a light shielding member 190.

The base 110 has a recessed shape indented from the upper face to the lower face. The outer shape when viewed from the top is rectangular, and the recess is formed inward of the outer shape. The base 110 has an upper face, a bottom face 111, a lower face, one or more inner lateral faces, and one or more outer lateral faces, in which the inner lateral faces and the bottom face 111 define the recess. Moreover, a rectangular frame is formed by the one or more inner lateral faces intersecting the upper face, and the recess is surrounded by the frame.

The base 110 has two stepped portions 112 inward of the frame. Here, the stepped portions 112 refer to the portions consisting of the upper face and the downward lateral face intersecting the upper face. Accordingly, the inner lateral faces of the base 110 include one or more lateral faces intersecting the upper face of the base 110 and one or more lateral faces of the stepped portions.

Here, the two stepped portions 112 are referred to as the first stepped portion 113 and the second stepped portion 114 counting from that located closer to the bottom face 111. The base 110 does not have to have two stepped portions 112. For example, it may have one stepped portion 112.

Where two surfaces meet can be identified from the drawings. In one example, the outer lateral faces can be said to meet the upper face and the lower face. In another example, the upper face of the first stepped portion 113 can be said to meet the lateral faces of the second stepped portion 114 extending upward therefrom at some locations, while meeting the lateral faces that meet the upper face of the base at other locations. Where two sides meet can similarly be identified.

The base 110 can be formed using a ceramic as a primary material. For example, aluminum nitride, silicon nitride, aluminum oxide, or silicon carbide can be used as a ceramic material. The material that can be used is not limited to ceramics. Other materials such as an insulation material may be used as a primary material to form the base. A metal film is disposed on the base 110 at multiple locations. A metal film is disposed at multiple locations on the upper face of the base 110 and in the recess.

A semiconductor laser element 120 has a rectangular outline when viewed from the top. The lateral face meeting one of the two short sides of the rectangle serves as the emission face through which the light is output from the semiconductor laser element 120. The upper face and the lower face of the semiconductor laser element 120 have larger areas than the emission face.

The light (laser beam) emitted from the semiconductor laser element spreads, forming an elliptical far field pattern (hereinafter referred to as "FFP") in a plane paralleling the emission face. Here, FFP refers to the shape and light intensity distribution of the emitted light at a location distant from the emission face.

The shape of the FFP of the emitted light from a semiconductor laser element 20 is an ellipse having a longer diameter in the stacking direction of the semiconductor layers including the active layer than a diameter in the layer direction perpendicular to the stacking direction of the semiconductor layers. In the FFP, the layer direction will be referred to as the lateral direction of the FFP, and the direction parallel to the stacking direction will be referred to as the vertical direction of the FFP.

Furthermore, the light having an intensity of at least $1/e^2$ relative to the peak intensity value based on the light intensity distribution of an FFP of a semiconductor laser element 120 will be referred to as the main portion of the emitted light. The angle corresponding to the full width at half maximum of the intensity distribution will be referred to as divergence angle. The divergence angle in the vertical direction of an FFP will be referred to as vertical divergence angle, and the divergence angle in the horizontal direction of an FFP will be referred to as horizontal divergence angle.

For a semiconductor laser element 120, for example, a blue light emitting semiconductor laser element can be employed. Here, blue light refers to light having a peak emission wavelength in the 420 nm to 494 nm range. The semiconductor laser element 120 may emit light of a color other than blue.

Examples of blue light emitting semiconductor laser elements include semiconductor laser elements including nitride semiconductors. For nitride semiconductors, for example, GaN, InGaN, and AlGaN can be used.

A submount 130 is shaped as a rectangular cuboid having a lower face, an upper face, and lateral faces. The up/down width of the submount 130 is smallest. The shape is not limited to a rectangular cuboid. The submount 130 is formed with, for example, silicon nitride, aluminum nitride, or silicon carbide. Other materials may be used. A metal film is formed on the upper face of the submount 130.

A light reflecting member 140 has a light reflecting face 141 configured to reflect light. The light reflecting face 141 is provided with a surface having a reflectance of at least 99% relative to the peak wavelength of the irradiated light, for example. The reflectance here can be set to 100% at most. The light reflecting face 141 may be composed of a plurality of planar shapes. The light reflecting face 141 may have a curved shape. The shape of the light reflecting face 141 is not limited to this, and can simply be suitably designed in accordance with the purpose.

Glass, metal, or the like can be used as a primary material to form the outer shape of a light reflecting member 140. A heat resistant material is preferably used as the primary material. For example, glass such as quartz or BK7 (borosilicate glass), metals such as aluminum, or Si can be used as the primary material. For example, multilayer dielectric films such as $Ta_2O_5/SiO_2$, $TiO_2/SiO_2$, $Nb_2O_5/SiO_2$ or the like can be used to form the light reflecting face.

Wirings 150 are used to electrically connect specific elements (for example, semiconductor laser elements). For the wiring 150, a metal wire can be used, for example.

A wavelength conversion part 160 has a composite member 180 composed of a wavelength conversion member 181 and an enclosing member 182, an optical film 183, a conducting layer 184, a metal film 185, a heat dissipating member 170, an optical film 171, a metal film 172, and an adhesive 173.

Aluminum oxide is used as a primary material for the wavelength conversion member 181. The wavelength conversion member 181 also contains a YAG phosphor. The weight ratio of the phosphor to aluminum oxide is 20 percent by weight. The porosity of the wavelength conversion member 181 is 2% at most.

Aluminum oxide is used as a primary material for the enclosing member 182. The enclosing member 182 contains yttrium oxide as an additive. The weight ratio of the additive to aluminum oxide is 1 percent by weight.

The optical film 183 is formed to a thickness in the range in a range of 0.05 μm to 1.0 μm. As an optical film 183, an anti-reflection film (AR film) is formed on the lower face of the composite member 180.

The conducting layer 184 is formed to a thickness in a range of 0.1 μm to 1.0 μm. The conducting layer 184 is disposed at a close position to the wavelength conversion member 181. The conducting layer 184 is disposed to surround the wavelength conversion member 181. The conducting layer 184 is formed by using indium tin oxide (ITO). ITO has a high optical transmittance in the visible range, and has effective transmissivity. It is thus considered as a light transmissive conducting member from this perspective.

The metal film 185 is formed by using Ti/Ru/Au. The metal film 185 is formed to a thickness in a range of 0.3 μm to 3.5 μm. The metal film 185 is linked to the conducting layer 184. The metal film 185 is formed thicker than the conducting layer 184.

Because it is formed thinly, the conducting layer 184 may extend to the lower face of the wavelength conversion member 181. In other words, the wavelength conversion member 181 may be in contact with a heat dissipating member 170 via a thin film, including the conducting layer 184, or the optical film 183 and the conducting layer 184.

For the heat dissipating member 180, sapphire, which has a relatively high refractive index and a relatively high strength, is used as a primary material. Moreover, the heat dissipating member 170 has effective transmissivity. An optical film 171 and two pieces of metal film 172 are disposed on the upper face of the heat dissipating member 170.

The optical film 171 is formed to a thickness in a range of 2.0 μm to 5.0 μm. The range does not have to be limited to this. An optical film that reflects light of specific wavelengths while transmitting light of other wavelengths is formed as the optical film 171 on the upper face of the heat dissipating member 170. For such an optical film, a DBR (distributed Bragg reflector) is used. The projected portion of the heat dissipating member 170 is formed by the optical film 171.

The metal film 172 is formed by using Ti/Pt/Au. The metal film 172 is formed to a thickness in a range of 0.2 μm to 3.5 μm. The thickness of the metal film 172 is smaller than the thickness of the optical film 171. The thickness of the metal film 172 can be set to ⅕ of the thickness of the optical film 171 at most.

For the adhesive 173, a metal adhesive such Au—Sn is used. The adhesive 173 is disposed on the metal film 172. The adhesive 173 is formed to a thickness in a range of 3.5 μm to 10.0 μm. The thickness of the adhesive 173 is larger than the thickness of the optical film 171. The thickness of the adhesive 173 can be set to at least 1.5 times the thickness of the optical film 171.

The metal film 185 of the composite member 180 and the metal film 172 of the heat dissipating member 170 are bonded via the adhesive 173 while positioning the optical film 171 directly under the wavelength conversion member 181. Accordingly, the optical film 171 and the wavelength conversion member 181 are not directly bonded together. Bonding of the heat dissipating member 170 and the composite member 180 electrically connects the metal film 172 and the conducting layer 184.

The conducting layer 184 surrounds the wavelength conversion member 181 in its vicinity. If an anomaly such as a crack occurs in the wavelength conversion member 181, a crack or the like will also occur in the conducting layer 184 in response to the shock to thereby cause a change in the state of the electrical connection. By detecting this change (for example, a considerable rise in the resistance), an anomaly in the wavelength conversion member 181 can be detected. The conducting layer 184 thus can be considered as an anomaly detection element, which is a sensor that detects any anomaly in the wavelength conversion member 181.

Forming the projected portion of the heat dissipating member 170 with the optical film 171 allows the fluorescence traveling from the wavelength conversion member 181 to the optical film 171 to be reflected thereby effectively outputting the wavelength-converted light upwards. By abutting the optical film 171 against the wavelength conversion member 181 instead of bonding thereto, the reflectance by the optical film 181 can be increased.

Disposing the projected portion of the heat dissipating member 170 so as not to overlap the metal film 185 of the composite member 180 when viewed from the top allows the projected portion of the heat dissipating member 170 to abut the wavelength conversion member 181 in a stable manner.

The light shielding member 190 is formed to fill the gap between the base 110 and the wavelength conversion part 160 in the light emitting device 100. For this reason, the shape of the light shielding member 190 will depend on the shape of the gap in the state prior to disposing the light shielding member 190.

The light shielding member 190 is formed by using a resin having light shielding properties. Here, the recitation that a member has "light shielding properties" means that the member does not transmit light, which may be achieved by utilizing light absorption and light reflection characteristics, in addition to light shielding characteristics. For example, light shielding properties can be achieved by allowing a resin to contain fillers such as a light diffuser and/or absorber.

Examples of resins for forming the light shielding member 190 include epoxy resins, silicone resins, acrylate resins, urethane resins, phenol resins, BT resin, and the like. Examples of light absorbing fillers include dark pigments such as carbon black and the like. The light shielding member 190 may be formed with a material other than these.

A method of manufacturing a light emitting device 100 having these components will be explained next.

First, two light reflecting members 140 are disposed on the bottom face 111 of the base 110. The bottom face 111 of the base 110 can be considered as a layout surface on which the components are arranged. The two light reflecting members 140 are arranged to have point symmetry. Moreover, the two light reflecting members 140 are such that the upper edges of the light reflecting faces 141 are in parallel with or orthogonal to the inner lateral faces or the outer lateral faces of the base 110 when viewed from the top.

Next, two submounts 130 are disposed on the bottom face 111 of the base 110. The two submounts 130 are disposed on different pieces of metal film, and their lower faces are bonded to the bottom face 111 of the base 110.

Next, semiconductor laser elements 120 are disposed on the submounts 130. The two semiconductor laser elements 120 are individually mounted on the different submounts 130, and their lower faces are bonded. The two semiconductor laser elements 120 are arranged to have point symmetry. They are arranged such that the point of symmetry coincides with the point of symmetry for the two light reflecting members 140. In the explanation below, this point will be referred to as the point of symmetry.

The emission faces of the two semiconductor laser elements 120 are not in parallel with or orthogonal to the inner lateral faces or the outer lateral faces of the base 110 when viewed from the top. Accordingly, they are not in parallel with or orthogonal to the upper edges of the light reflecting faces 141. In other words, the semiconductor laser elements 120 are disposed such that the emission faces are oblique to the inner lateral faces or the outer lateral faces of the base 110, or upper edges of the light reflecting faces 141, when viewed from the top.

Instead of disposing the semiconductor laser elements 120 obliquely, the light reflecting members 140 may be obliquely arranged. In other words, the semiconductor laser elements 120 may be disposed in parallel with or orthogonal to the inner lateral faces or the outer lateral faces of the base 110 while disposing the light reflecting members 140 not in parallel with or orthogonal thereto.

Each of the two semiconductor laser elements 120 emits light to a different light reflecting member 140. In other words, light from one of the semiconductor laser elements 120 is irradiated against the light reflecting member 140 corresponding to that semiconductor laser element 120. Moreover, each semiconductor laser element 120 is arranged such that at least the main portion of the emitted light is irradiated against the light reflecting face 141.

The semiconductor laser elements 120 are located farther from the point of symmetry than the light reflecting members 140 between the corresponding semiconductor laser elements 120 and the light reflecting members 140. Accordingly, the light emitted from the semiconductor laser elements 120 will travel in the direction towards the point of symmetry.

The submounts 130 bearing the semiconductor laser elements 120 play the role as heat dissipating members to dissipate the heat generated by the semiconductor laser elements 120 in the light emitting device 100. The submounts 130 can simply be formed with a material having a higher thermal conductivity than the semiconductor laser elements 120 in order to allow them to function as heat dissipating members.

The submounts 130, moreover, can play the role of adjusting the positions of the light emitted by the semiconductor laser elements in the light emitting device 100. For example, in the case of making the light traveling along the optical axis parallel with the bottom face 111 and irradiate a prescribed position of a light reflecting face 141, the submount can be used as an adjusting member.

Next, wirings 150 are connected in order to electrically connect the components arranged on the bottom face 111. Furthermore, the wiring 150 is disposed to electrically connect the metal film disposed on the bottom face 111 and the components. By using the wirings 150, the two semiconductor laser elements are connected in series.

Next, a wavelength conversion part 160 is arranged on the upper face of the base 110. The wavelength conversion part 160 is arranged such that the lower face thereof is positioned on and bonded to the upper face of the stepped portion 112. More specifically, the wavelength conversion part 160 is bonded to the upper face of the first stepped portion 113. The wavelength conversion part 160 is bonded such that the metal film disposed in the outer peripheral region of the lower face of the heat dissipating member 170 and the metal film disposed on the upper face of the first stepped portion 113 are bonded and secured via Au—Sn or the like.

Bonding of the wavelength conversion part 160 and the base 110 creates a closed space in which the semiconductor laser elements 120 are arranged. In the light emitting device 100, the wavelength conversion part 160 or the heat dissipating member 170 can play the role as a cover. This closed space is formed in a hermetically sealed state. Hermetically sealing the space can restrain dust, such as organic substances, from collecting on the emission faces of the semiconductor laser elements 120.

The light emitted from the two semiconductor laser elements 120 is respectively reflected by the light reflecting faces 141 of the corresponding light reflecting members 140 and passes through the heat dissipating member 170 disposed above before entering the lower face of the wavelength conversion member 181.

The light entering the wavelength conversion member 181 in part or whole is converted by the wavelength conversion member 181 into light of a different wavelength. The laser beam or the wavelength-converted light is extracted from the light emitting device 100 through the upper face of the wavelength conversion member 181. The wavelength-converted light reflected by the optical film 171 is also output from the light emitting device 100. In other words, the upper face of the wavelength conversion member 181 serves as the light extraction face of the light emitting device 100.

Neither of the emitted beams from the two semiconductor laser elements traveling along the optical axes goes through the center of the lower face of the wavelength conversion member 181. Moreover, the emitted beams from the semiconductor laser elements traveling along the optical axes do not overlap at the entrance face (lower face) of the wavelength conversion member 181.

Next, wirings 150 are connected to electrically connect the anomaly detection element. The wirings 150 are connected to the metal films disposed on the second stepped portions 114 of the base 110 and the metal films 172 of the heat dissipating member 170.

Next, a light shielding member 190 is disposed inward of the frame formed by the upper face of the base 110. The light shielding member 190 can be formed by allowing a resin to flow in and be hardened by heating. The resin does not penetrate the closed space in which the semiconductor laser elements 120 are arranged.

The light shielding member 190 encloses the wiring 150 arranged on the second stepped portion 114. In other words, when the light shielding member 190 is completed, the wirings 150 are not exposed in the light emitting device 100. This can protect the wirings 150 from water droplets or the like. The light shielding member does not necessarily enclose the wiring 150.

In the foregoing, a light emitting device according to one embodiment has been described, but the form of a light emitting device having a wavelength conversion part is not limited to this. A light emitting device may have a component not disclosed by the embodiment. For example, a light emitting device may have a protective device disposed on the bottom face 111 of the base 110. A light emitting device may have a temperature measuring element on the bottom face 111 of the base 110.

Certain embodiments of the present invention have been described. The scope of the present invention, however, is not limited to the configurations of the described embodiments. For example, the present invention is applicable to a wavelength conversion part or a light emitting device having a component not disclosed in any of the embodiments. As such, the mere fact that there is a difference from the disclosed part or device would not provide any grounds for the inapplicability of the present invention.

In other words, the present invention is applicable to a device even if the device does not include all of the components of the part or device in the described embodiments. For example, in the event that a certain component of a light emitting device included any of the embodiments is not recited in the claim, the claimed invention may still be applicable in view of the design flexibility of a person of ordinary skill in the art for such a component through the use of an alternative, an omission, a shape change, a change in the materials employed, or the like, without limiting it to what is disclosed in the embodiment.

The light emitting devices of the present disclosure can be used as light sources for automotive headlights, lighting fixtures, projectors, backlights for head mounted displays and other displays.

What is claimed is:

1. A wavelength conversion part comprising:
    a wavelength conversion member formed primarily of a ceramic material, wherein the wavelength conversion member has a lower face and one or more lateral faces;
    an enclosing member formed primarily of a ceramic material, wherein the enclosing member has a lower face, wherein the enclosing member surrounds the one or more lateral faces of the wavelength conversion member; and
    a heat dissipating member having an upper face, wherein the heat dissipating member is fixed to the wavelength conversion member, and wherein the upper face of the heat dissipating member opposes the lower face of the wavelength conversion member and the lower face of the enclosing member;
    wherein the lower face of the wavelength conversion member projects towards the heat dissipating member beyond the lower face of the enclosing member; and
    wherein a portion of the lower face of the enclosing member is separated from the upper face of the heat dissipating member by an air gap.

2. The wavelength conversion part according to claim 1, wherein:
    an entirety of the lower face of the enclosing member is separated from the upper face of the heat dissipating member.

3. The wavelength conversion part according to claim 1, further comprising an adhesive disposed between a portion of the lower face of the enclosing member and the upper face of the heat dissipating member.

4. The wavelength conversion part according to claim 3, wherein:
    an area of the portion of the lower face of the enclosing member at which the adhesive is disposed is smaller than an area of the portion of the lower face of the enclosing member that is separated from the upper face of the heat dissipating member by the air gap.

5. The wavelength conversion part according to claim 1, wherein;
    the heat dissipating member has a projection at a central portion of the upper face.

6. The wavelength conversion part according to claim 5, wherein:
    an uppermost part of the upper surface of the heat dissipating member is located under the wavelength conversion member and a lowermost part of the upper surface of the heat dissipating member is located under the enclosing member.

7. The wavelength conversion part according to claim 1, wherein the wavelength conversion member abuts the heat dissipating member.

8. The wavelength conversion part according to claim 1, wherein;
in a direction perpendicular to the upper face of the heat dissipating member, a distance between an upper face of the enclosing member and a lower face of the heat dissipating member is larger than a sum of thickness of the enclosing member and a thickness of the heat dissipating member.

9. The wavelength conversion part according to claim 1, further comprising:
an upper holding member having a lower face that contacts an upper face of the enclosing member;
a lower holding member having an upper face that contacts a lower face of the heat dissipating member; and
a plurality of fasteners connecting the upper holding member and the lower holding member;
wherein the wavelength conversion member, the enclosing member, and the heat dissipating member are fixed by the upper holding member, the lower holding member, and the fastener.

10. The wavelength conversion part according to claim 9, wherein the upper holding member and the lower holding member are formed primarily of a metal.

11. The wavelength conversion part according to claim 9, wherein;
the upper holding member has fastener holes penetrating from an upper face to the lower face at four corners in a top view;
the lower holding member has fastener holes at four corners in a top view; and
the plurality of fasteners comprises four fasteners, one extending through each of corresponding sets of one of the fastener holes of the upper holding member and one of the fastener holes of the lower holding member.

12. The wavelength conversion part according to claim 11, wherein:
the fastener holes in the upper holding member and the fastener holes in the lower holding member are screw holes, and
the fasteners are screws.

13. The wavelength conversion part according to claim 11, wherein;
the fastener holes in the lower holding member do not penetrate through the lower face of the heat dissipating member.

14. The wavelength conversion part according to claim 11, wherein;
the upper holding member has a circular through hole in a central portion of the upper holding member, and, in a top view, an entirely of the upper face of the wavelength conversion member is in the circular through hole;
wherein a diameter of the circular through hole is larger than a diameter of each of the fastener holes of the upper holding member.

* * * * *